United States Patent
Lin et al.

(10) Patent No.: US 9,192,063 B2
(45) Date of Patent: Nov. 17, 2015

(54) FLASH DRIVE AND OPERATING METHOD THEREOF

(71) Applicant: PHISON ELECTRONICS CORP., Miaoli (TW)

(72) Inventors: Wei-Hung Lin, Hsinchu County (TW); Yu-Ting Tseng, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 213 days.

(21) Appl. No.: 14/093,529

(22) Filed: Dec. 2, 2013

(65) Prior Publication Data

US 2015/0109725 A1   Apr. 23, 2015

(30) Foreign Application Priority Data

Oct. 21, 2013   (TW) .............................. 102137941 A

(51) Int. Cl.
*G06F 1/16* (2006.01)
*H05K 5/02* (2006.01)

(52) U.S. Cl.
CPC .................................... *H05K 5/0217* (2013.01)

(58) Field of Classification Search
CPC .................................................. H05K 5/0217
USPC ........................... 361/679.01, 679.02, 679.32
See application file for complete search history.

(56) References Cited

U.S. PATENT DOCUMENTS

| | | | | |
|---|---|---|---|---|
| 7,092,256 B1* | 8/2006 | Salazar | ................ | H05K 5/0278 361/679.32 |
| 7,679,008 B2* | 3/2010 | Lee | .................. | G06K 19/07732 174/521 |
| 7,778,037 B2* | 8/2010 | Huang | ................... | G06K 19/07 361/737 |
| 2005/0180101 A1* | 8/2005 | Yu | .......................... | H01R 31/06 361/679.37 |
| 2013/0201622 A1* | 8/2013 | Liu | ....................... | H05K 5/0278 361/679.32 |
| 2014/0281139 A1* | 9/2014 | Smurthwaite | ........ | H05K 5/0278 711/103 |
| 2015/0043149 A1* | 2/2015 | Chou | ................... | G06K 7/0021 361/679.32 |

* cited by examiner

*Primary Examiner* — Anthony Q Edwards
(74) *Attorney, Agent, or Firm* — Jianq Chyun IP Office

(57) ABSTRACT

A flash drive including a storage element, a housing, and an integrating member is provided. The storage element has a first connector and a second connector. The integrating member is pivoted to the storage member and coupled to the housing, wherein the integrating member and the housing move relatively in a first path or a second path. The integrating member and the housing move relatively along the first path, such that the first connector is extended outside or hidden inside the housing. The integrating member and the housing move relatively along the second path and drive the storage element to move relative to the integrating member, such that the second connector is extended outside or hidden in the integrating member. An operating method of flash drive is also provided.

16 Claims, 6 Drawing Sheets

FLASH DRIVE AND OPERATING METHOD THEREOF

CROSS-REFERENCE TO RELATED APPLICATION

This application claims the priority benefit of Taiwan application serial no. 102137941, filed on Oct. 21, 2013. The entirety of the above-mentioned patent application is hereby incorporated by reference herein and made a part of this specification.

BACKGROUND

1. Field of the Invention

The present invention is related to a flash drive and more particularly, to a flash drive having a plurality of connectors.

2. Description of Related Art

Conventional floppy disk in 1.44 MB features in its portable characteristic but still fails to meet the requirement of large storage capacity. Although a conventional hard disk provides a large storage capacity, it still suffers in bulk size which leads to inconvenient carrying. Rewritable non-volatile memory has the characteristics of data non-volatility, low power consumption, compact size, and non-mechanical structure. Hence, rewritable non-volatile memory is adapted for portable appliances, especially portable products powered by batteries.

A flash drive is a storage device adopting NAND flash memory as storage medium and features in large storage capacity, plug-and-play, compact size and portability for substituting for the floppy disk. Nevertheless, with the variety of connection and transmission standards of present electronic apparatuses, the flash drive having a connector with only one connection format is losing its applicability. Therefore, how to increase the applicability range of the flash drive as well as keep the convenience have become a problem to be solved for person skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a flash drive having a plurality of connectors capable of moving out of the housing in different moving paths.

The present invention provides a method of operating a flash drive, by which connectors are moved in multiple sections, such that a user may select a desired connector to use.

The present invention provides a flash drive including a storage element, a housing and an integrating member. The storage element has a first connector and a second connector. The housing movably covers a part of the storage element. The integrating member is pivoted to the storage element, coupled to the housing and adapted to move relatively to the housing in a first path or a second path. When the integrating member moves relatively to the housing along the first path, the first connector is accordingly exposed from or hidden in the housing. When the integrating member moves relatively to the housing along the second path and drives the storage element to move relatively to the integrating member, the second connector is exposed from or hidden in the integrating member.

The present invention provides a method for operating a flash drive. The flash drive includes a storage element, a housing and an integrating member. The storage element has a first connector and a second connector. A part of storage element is movably contained in the housing. The integrating member is pivoted to the storage element and movably coupled to the housing. The method for operating the flash drive includes the following steps. The integrating member is driven to move relatively to the housing in a first path, such that the first connector is exposed from or hidden in the housing, and the flash drive is transited between a first state and a second state. The integrating member is driven to move relatively to the housing in a second path and drive the storage element to move relatively to the integrating member back and forth, such that the second connector is exposed from or hidden in the integrating member, and the flash drive is transited between the first state and a third state. The first path is connected with but different from the second path.

Based on the above, in the flash drive, with the disposition of and the connection among the storage element, the housing and the integrating member, the housing and the integrating member can move relatively to each other along the first path and the second path. When the housing and the integrating member move relatively to each other along the first path, the first connector of the storage element can be thereby exposed from or hidden in the housing, and when moving along the second path, the second connector can be thereby exposed from or hidden in the integrating member along with the housing. By doing so, a user can select different connectors based on the paths depending on the usage sate thereof, such that the flash drive not only can enhance the application range due to having different types of connectors but also allow the user to drive the desired connector to be exposed for use in a simple driving way.

In order to make the aforementioned and other features and advantages of the present invention more comprehensible, several embodiments accompanied with figures are described in detail below.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
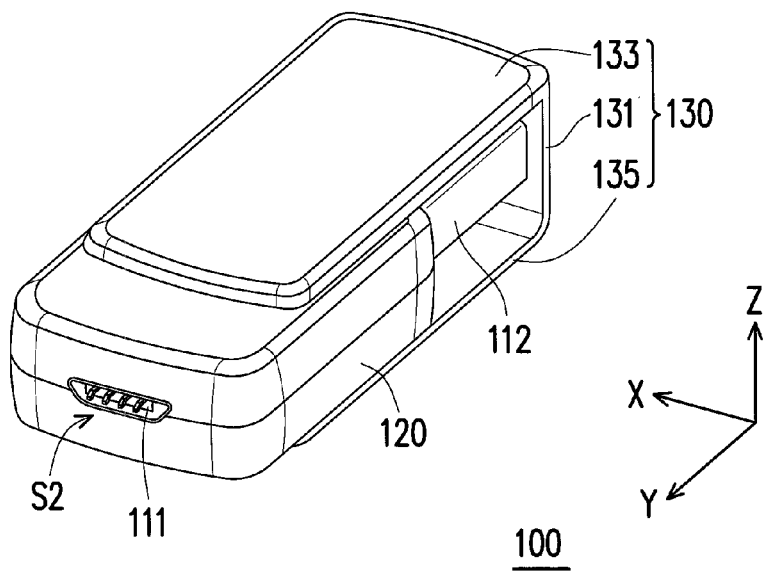
FIG. 1 is a schematic diagram illustrating a flash drive according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A,B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
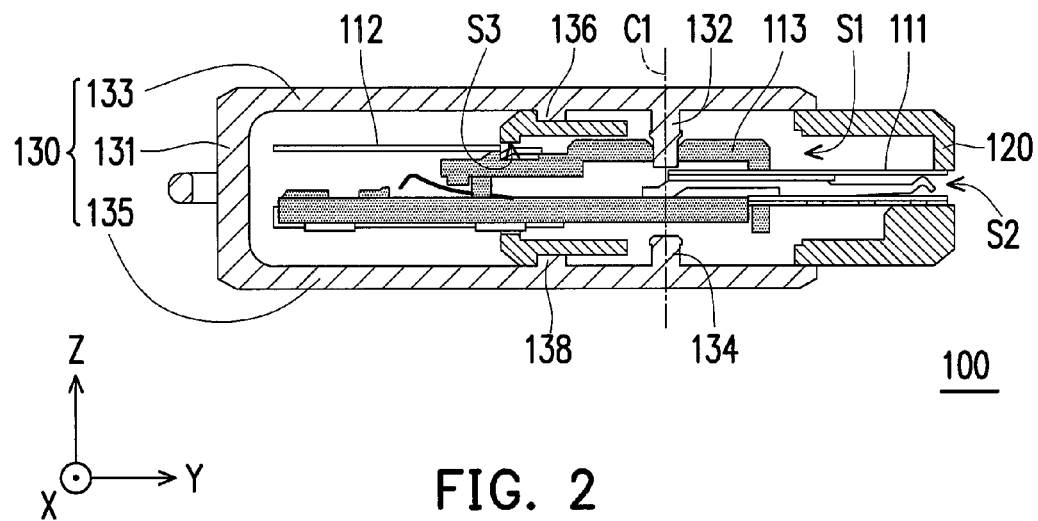
FIG. 2 is cross-sectional view of the flash drive illustrated in FIG. 1.
Figure 3:
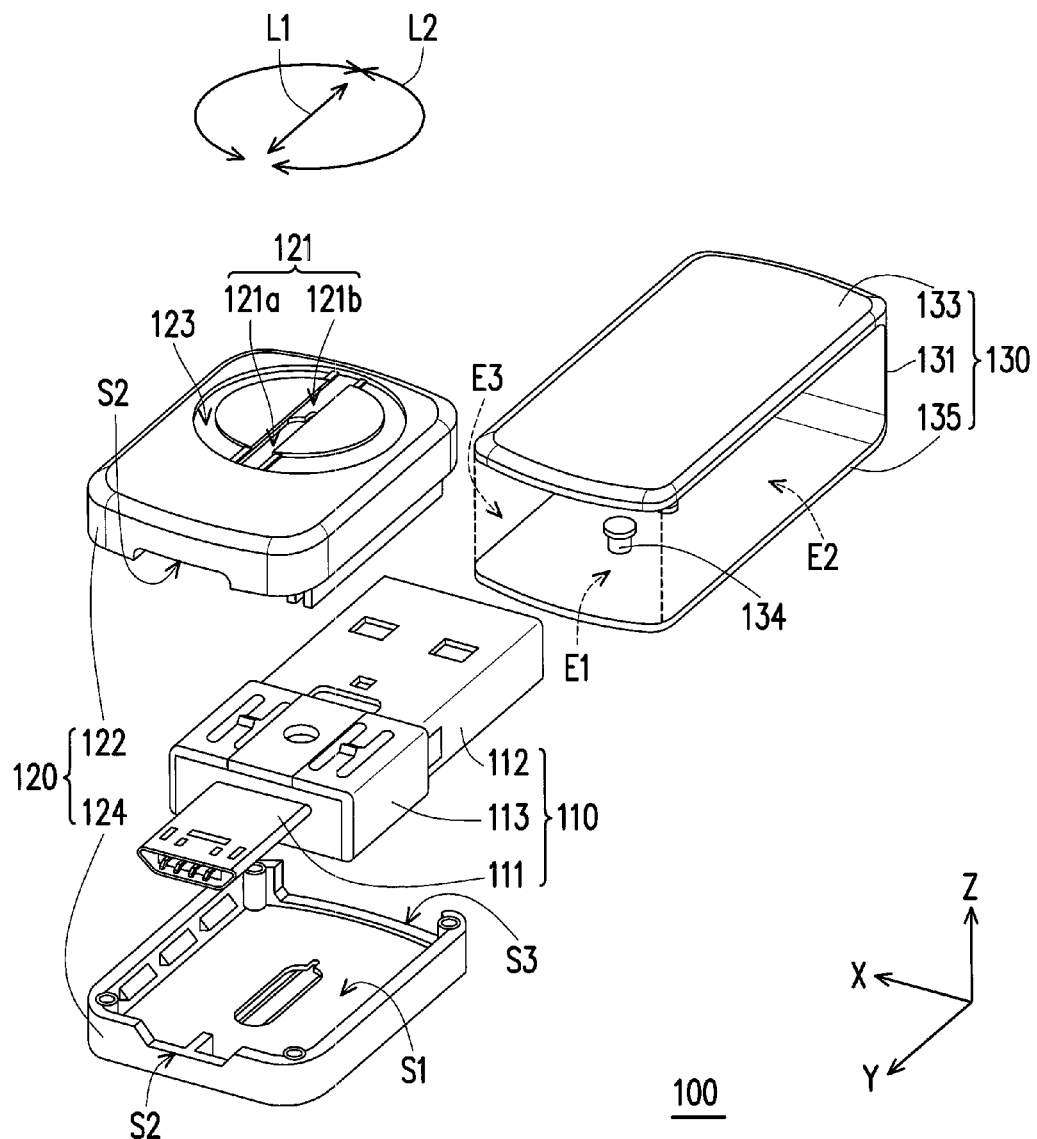
FIG. 3 is an exploded view of the flash drive illustrated in FIG. 1.

FIG. 1 is a schematic diagram illustrating a flash drive according to an exemplary embodiment of the present invention. FIG. 2 is cross-sectional view of the flash drive illustrated in FIG. 1. FIG. 3 is an exploded view of the flash drive illustrated in FIG. 1. Herein, a Cartesian coordinate system is also provided in the present exemplary embodiment for the convenience of the subsequent description. With reference to FIG. 1 to FIG. 3, a flash drive 100 includes a storage element 110, a housing 120 and an integrating member 130. The storage element 110 includes a main body 113 and a first connector 111 and a second connector 112 which extend toward opposite sides from the main body 113. The main body 130 is, for example, a package formed by packaging one or more chips with any one or more of elements, such as passive components, capacitors, resistors, connectors, antennas and so on by utilizing a system in package (SIP) technique in a chip package body. The first connector 111, the main body 113 and the second connector 112 are electrically connected with one another, such that a user may connect the first connector 111 or the second connector 112 with a connector of another electronic apparatus (not shown) according to his/her needs. In the present exemplary embodiment, the first connector 111 is a micro universal serial bus (Micro-USB) connector, and the second connector 112 is a universal serial bus (USB) connector, which is not limited in the present exemplary embodiment. In other exemplary embodiments that are not illustrate, the storage element may also use connectors of different standards as interfaces for connecting with the external and other elements of the present invention that will be described below, such that the flash drive of the present invention can be connected with other electronic apparatuses using the connectors of different standards, respectively.

With reference to FIG. 2 and FIG. 3, in the present exemplary embodiment, the integrating member 130 is a recess structure formed by a connecting wall 131 and a pair of side walls 133 and 135, and thereby, a front opening E1 and a pair of side openings E2 and E3 located at opposite sides of the front opening E1 are formed. (Herein, in order to conveniently describe the integrating member 130, the openings are illustrated by dashed-line contours in FIG. 3.) The integrating member 130 further has a pair of protrusions 132 and 134 which respectively extend from the side walls 133 and 135 toward the opposite side walls and are directly or indirectly pivoted to the main body 113 of the storage element 110, such that the storage element 110 may rotate relatively to the integrating member 130 around a central axis C1 formed by the protrusions 132 and 134.

Furthermore, the housing 120 is formed by combining a first member 122 and a second member 124, and the combined first member 122 and second member 124 form a containing space S1 and openings S2 and S3 located at opposite sides of the containing space S1. At least a part of the storage element 110 may be movably contained in the containing space S1 along the Y axis, such that the housing 120 may movably cover at least a part of the storage element 110, and a structure where the housing 120 and the storage element 110 may be movably sandwiched between the side walls 133 and 135.

Additionally, the housing 120 further has trails 121 and 123 located on the outer surface thereof (since the trails 121 and 123 of the housing 120 are distributed in both the first member 122 and the second member 124 and have the same capability, only the trails 121 and 123 located on the first member 122 are illustrated for related description). Correspondingly, the integrating member 130 also has protrusions 136 and 138 extending oppositely from the two side walls 133 and 135. After oppositely and slidably passing through a part of the trail 121, the protrusions 132 and 134 are pivoted to the main body 113 of the storage element 110. The protrusions 136 and 138 are slidably coupled to a part of the trail 121 and the trail 123, and namely, each of the protrusions 132, 134, 136 and 138 is a pillar structure, and the protrusions 132 and 134 have a gap (along the Z axis) therebetween and the protrusions 136 and 138 have a gap therebetween. When the protrusions 136 and 138 are coupled to a par to the trail 121, the integrating member 130 may move relatively to the housing 120 along the first path L1, and when the protrusions 136 and 138 are coupled to the trail 123, the integrating member 130 may move relatively to the housing 120 along the second path L2. The first path L1 and the second. path L2 are connected with but different from each other. Here, the paths L1 and L2 are labeled on the upper side of FIG. 3 for clear identification. It should be further mentioned that in the embodiment of the present invention, the coupling relationship between the related elements does not refer to fixed connection between the elements, but a corresponding relationship between the elements that may move relatively to each other, where the mode of the relative movement is not limited.

To be more detailed, in the present exemplary embodiment, the trail 121 is in a linear contour, and the trail 123 is in at least a part of a circular contour. The trail 121 includes a first section 121a and a second section 121b. The first section 121a is an elongated through hole on the housing 120, the second section 121b is an elongated recess, the trail 123 is a circular recess, and the second section 121b is connected between the first section 121 a and the trail 123. Thereby, the protrusions 132 and 134 pass through the first section 121a of the trail 121 and may slide back and forth around the elongated through hole, while the protrusions 136 and 138 are coupled to the elongated recess (the second section 121b) and the circular recess (the second trail 123) so as to slide back and forth therein.

Furthermore, in the present exemplary embodiment, the trail 121 in the linear contour is substantial a diameter of the trail 123 in the circular contour, and a relative distance between the protrusions 132 and 136 on the same side wall 133 or 135 (a relative distance between 134 and 138) is equal to a radius of the circular contour. Moreover, the protrusions 132 and 134 are limited by the structural feature of the elongated through hole of the first section 121a and allowed to only slide back and forth along the Y axis. Accordingly, the protrusions 132 and 136 (or the protrusions 134 and 138) may be operated with the trails 121 and 123 to form the first path L1 (which is in the linear contour) and the second path L2 (which is in the at least partially circular contour).

Figure 4:
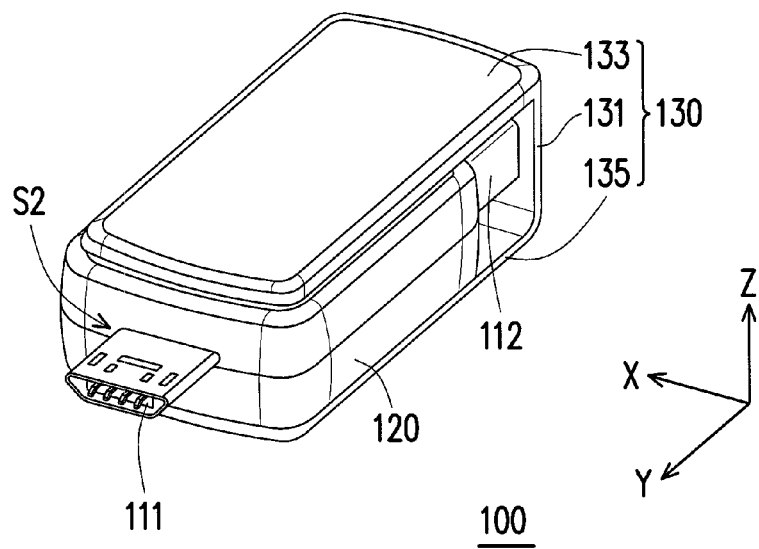
FIG. 4 and FIG. 7 are schematic diagrams illustrating the flash drive of FIG. 1 in different states.
Figure 5:
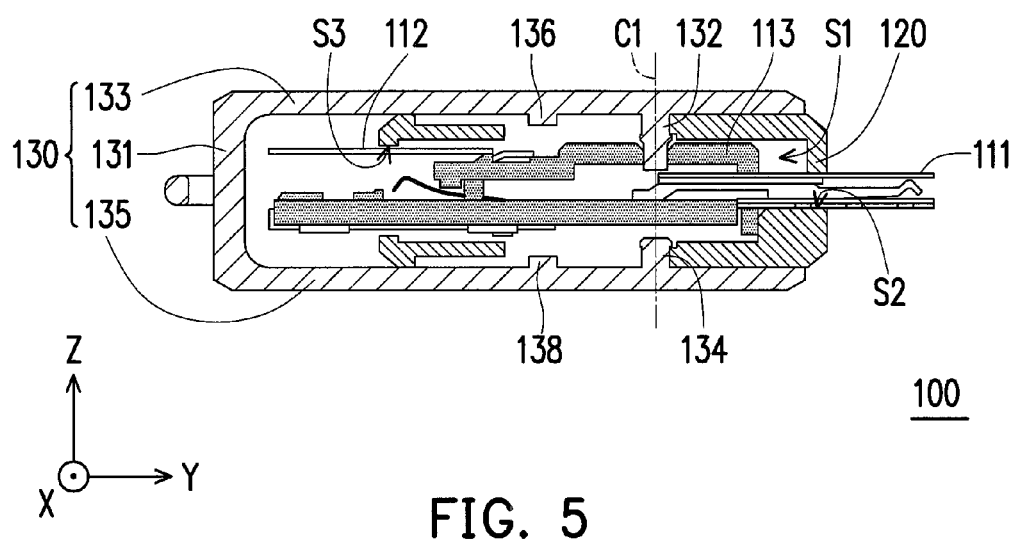
FIG. 5 is a cross-sectional view of the flash drive illustrated in FIG. 4.
Figure 6:
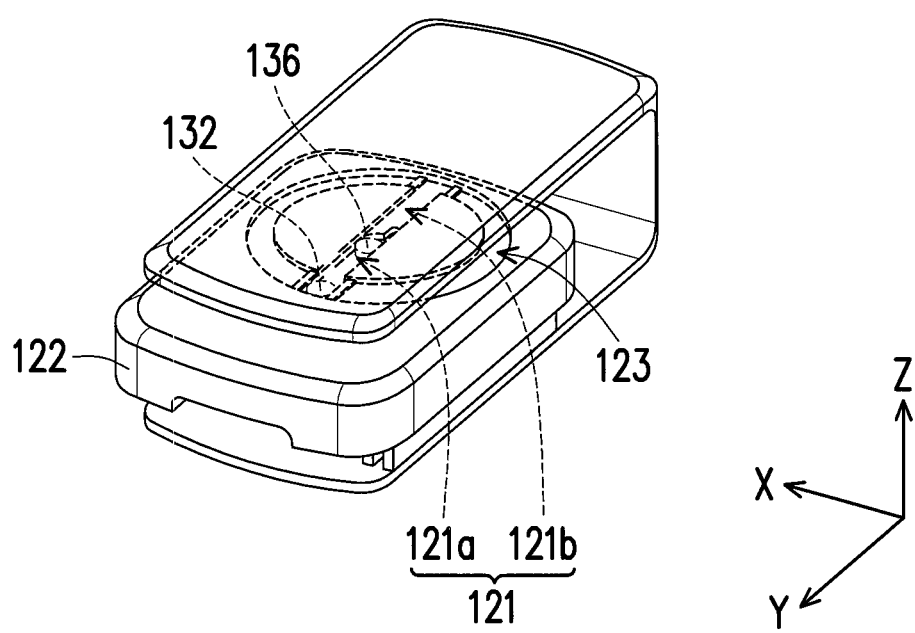
FIG. 6 is a partial schematic diagram of the flash drive illustrated in FIG. 4.
Figure 7:
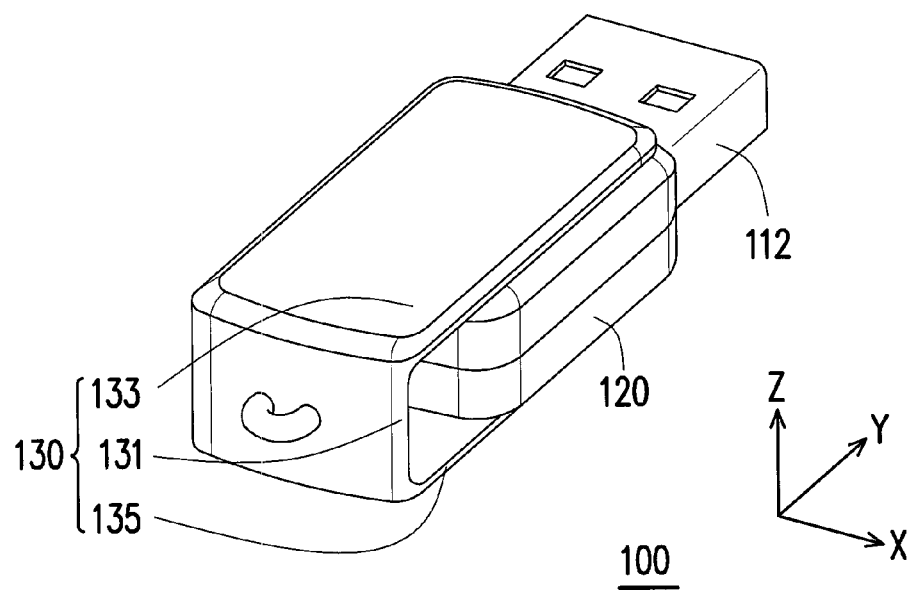
Figure 8:
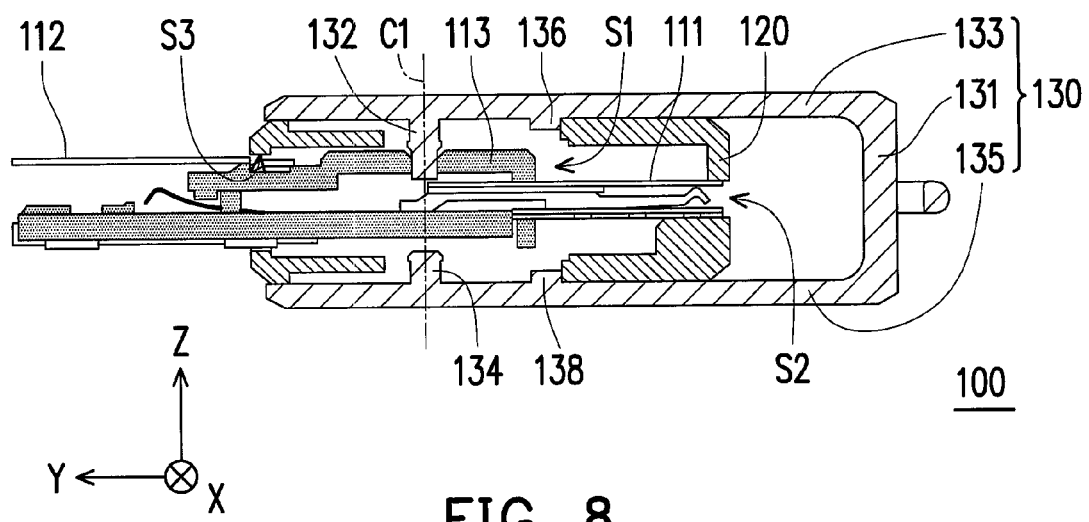
FIG. 8 is a cross-sectional view of the flash drive illustrated in FIG. 7.
Figure 9:
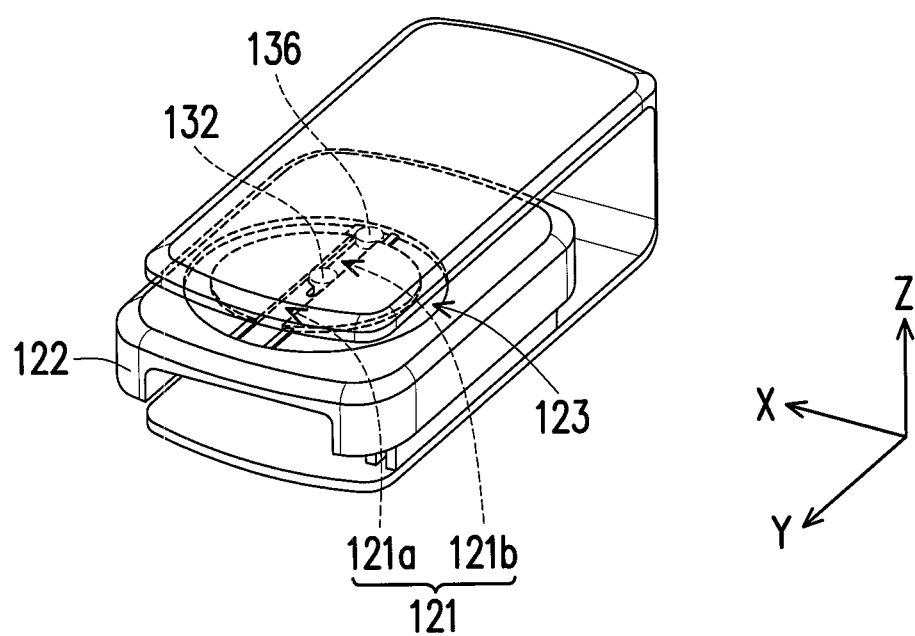
FIG. 9 is a partial schematic diagram of the flash drive illustrated in FIG. 7.

Hereinafter, corresponding states of the flash drive 100 which are generated after relative movements between the integrating member 130 and the housing 120 will be described. FIG. 4 and FIG. 7 are schematic diagrams illustrating the flash drive of FIG. 1 in different states. FIG. 5 is a cross-sectional view of the flash drive illustrated in FIG. 4. FIG. 6 is a partial schematic diagram of the flash drive illustrated in FIG. 4. FIG. 8 is a cross-sectional view of the flash drive illustrated in FIG. 7. FIG. 9 is a partial schematic diagram of the flash drive illustrated in FIG. 7.

First, referring to FIG. 4 to FIG. 6 with reference to FIG. 1 to FIG. 3, when the flash drive 100 is in the first state illustrated in FIG. 1 (or FIG. 2), the protrusions 132 and 134 pivoted to the storage element 110 at this time are located in the first section 121a of the trail 121 and near the second section 121b (i.e., located on the junction between the first section 121a and the second section 121b, which is near the center of the circular contour), while the protrusions 136 and 138 are located on the junction between the second section 121b and the trail 123. Referring to FIG. 1 and FIG. 2, at this time, a part of the housing 120 protrudes out of the front opening E1, the first connector 111 is in a state of being embedded in the housing 120, and the second connector 112 is hidden in the recess structure formed by the integrating member 130 with the interface facing the connecting wall 131.

It should be mentioned herein that since the integrating member 130 and the storage element 110 only have the pivotal connection therebetween, any movement other than the integrating member 130 and the storage element 110 rotating relatively around the central axis C1 would not occur. In other words, when the housing 120 and the integrating member 130 linearly move relatively to each other, the movement can not affect the relative movement of the storage element 110 to the integrating member 130, but instead, the movement drives the storage element 110 to rotate relatively to the integrating member 130 only when the housing 120 rotates relatively to the integrating member 130.

Then, when the protrusions 132 and 134 move along the first section 121a toward the positive Y-axial direction (i.e., the protrusions 132 and 134 gradually depart from the second section 121b), the protrusions 136 and 138 and the protrusions 132 and 134 move in the same way along the second section 121b until the protrusions 132 and 134 arrives at an end of the first section 121a which is away from the second section 121b, and the protrusions 136 and 138 move to the junction between the first section 121a and the second section 121b (i.e., near the center of the circular contour). By doing so, the housing 120 may move relatively to the integrating member 130 along the linear first path L1, that is, the housing 120 moves toward the negative Y-axial direction into the recess structure through the front opening E1 (labeled in FIG. 3), such that the first connector 111 passes through the opening S2 and is exposed from the housing 120, which at the same time, results in at least a part of the second connector 112 located in the recess structure moves into the housing 120 through the opening S1. Accordingly, the first connector 111 is in a second state of protruding from the front opening E1, such that the user may hold the integrating member 130 and use the first connector 111 as a connection interface for connecting the flash drive 100 with another electronic apparatus.

It is should be noticed that the protrusions 136 and 138 at this time are located in the center of the trail 121 (near the center of the circular contour) and thus, are limited by the linear recess structure and the trail 121 of the elongated through hole, such that the housing 120 and the integrating member 130 are merely allowed to move along the Y axis. In other words, the housing 120 in this state is incapable of rotating relatively to the integrating member 130.

In light of the foregoing, only by simple operation steps, the user can drive the housing 120 to move relatively to the storage element 110 and the integrating member 130 back and forth along the first path L1, such that the first connector 111 can be exposed from or hidden in the housing 120, and the flash drive 100 can be transited between the first state depicted in FIG. 1 and the second state depicted in FIG. 4.

With reference to FIG. 7 to FIG. 9 and FIG. 1 to FIG. 3, when desiring to use the second connector 112 as an interface for connecting the flash drive 100 with another electronic apparatus, the user needs to return the flash drive 100 back to the first state depicted in FIG. 1. Then, the user has to drive the housing 120 to move along the second path L2 and simultaneously drive the storage element 110 to move relatively to the integrating member 130 back and forth, such that the second connector 112 is exposed from or hidden in the integrating member 130, and the flash drive 100 is transited between the state depicted in FIG. 1 and third state depicted in FIG. 7.

To be more detailed, as described in the above, when the flash drive 100 is in the first state, the protrusions 132 and 134 are located at the junction between the first section 121a and the second section 121b (i.e., near the center of the circular contour), that is, the protrusions 132 and 134 at this time are interfered by the elongated through hole of the first section 121a along the positive Y axial direction. Moreover, the protrusions 136 and 138 are located at the junction between the second section 121b and the trail 123. In this way, the protrusions 136 and 138 may move toward the trail 123, such that the housing 120 may rotate relatively to the integrating member 130 and thus, drive the storage element 110 to rotate relatively to the integrating member 130 in the second path L2, and accordingly, the second connector 112 may rotate out of the integrating member 130 through the side opening E2 or E3 until the second connector 112 is in the third state and protrudes from the front opening E1 of the integrating member 130, as illustrated in FIG. 7.

It should be noticed herein that when the flash drive 100 is in the third state, the protrusions 136 and 138 of the integrating member 130 of the flash drive 100 are in an interfered state with the housing 120 along the negative Y axial direction, as illustrated in FIG. 8. Thus, when the user holds the integrating member 130 and use the second connector 112 to connect another electronic apparatus, the storage element 110 is prevented from moving relatively to the housing 120 along the negative Y axial direction due to the interfered state, such that the second connector 112 is prevented from being retracted back to the housing 120.

The type of the second path L2 is not limited herein, and as illustrated in the present exemplary embodiment (with reference to FIG. 3 simultaneously), the second path L2 is in a circular contour. Thus, the protrusions 136 and 138 may move along semicircular paths toward different directions, such that the second connector 112 rotates out of the integrating member 130 through the side opening E2 or the side opening E3. In another embodiment that is not shown, it may also be only one of the semicircular paths, and the second connector is only allowed to rotate out of the integrating member through only one of the side openings. In other words, in the exemplary embodiments of the present invention, the second path L2 belongs to at least a part of the circular path.

To sum up, in the flash drive of the present invention, with the disposition of and the connection among the storage element, the housing and the integrating member, the housing and the integrating member can move relatively to each other along the first path and the second path. When the housing and the integrating member move relatively to each other along the first path, the first connector of the storage element can be thereby exposed from or hidden in the housing, and when moving along the second path, the second connector can be thereby exposed from or hidden in the integrating member along with the housing.

In other words, with the design of the trails on the housing which are operated with the protrusions on the integrating member, the housing and the integrating member moves relatively to each other along different paths, such that the flash drive can be transited among three states. Moreover, when being in the state that the connector is exposed and in use, the stability of the flash drive can be improved by preventing the connector thereof from relative displacement with the structural interference between the protrusions and the trails.

By doing so, the user can select different connectors based on the paths depending on the usage sate thereof, such that the flash drive not only can enhance the application range due to having different types of connectors but also allow the user to drive the desired connector to be exposed for use in a simple driving way.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash drive, comprising:
a storage element, having a first connector and a second connector;
a housing, movably covering a part of the storage element; and
an integrating member, pivoted to the storage element and adapted to move relatively to the housing in a first path or a second path, wherein when the integrating member moves relatively to the housing along the first path, the first connector is accordingly exposed from or hidden in the housing, and when the integrating member moves relatively to the housing along the second path and drives the storage element to move relatively to the integrating member, the second connector is accordingly exposed from or hidden in the integrating member.

2. The flash drive according to claim 1, wherein the integrating member is a recess structure having a front opening and a pair of side openings located at opposite sides of the front opening,
wherein when the flash drive is in a first state, the housing and the storage element are located in the recess structure, a part of the housing and a part of the storage element protrudes out of the recess structure through the front opening, and the first connector is hidden in the housing,
wherein during the process of the flash drive being transited from the first state to a second state, the housing moves relatively to the storage element and the integrating member along the first path to move from the front opening into the recess structure, such that the first connector is exposed from the housing, and
wherein during the process of the flash drive being transited from the first state to a third state, the housing moves along the second path and drives the storage element to rotate relatively to the integrating member, such that the second connector is exposed from the integrating member through one of the side openings.

3. The flash drive according to claim 2, wherein when the flash drive is in the first state, the second connector is hidden in the recess structure, when the flash drive is in the second state, the second connector is hidden in the recess structure with at least a part embedded into the housing, and when the flash drive is in the third state, the second connector protrudes out of the front opening.

4. The flash drive according to claim 1, wherein the integrating member is a recess structure having two opposite side walls, the housing and the storage element are movably sandwiched between the two side walls, the first path and the second path are located on the same plane parallel to the two side walls.

5. The flash drive according to claim 1, wherein the integrating member has a first protruding portion and a second protruding portion, the housing has a first trail and a second trail, the first protruding portion is used to movably penetrate through a part of the first trail and pivoted to the storage element, and the second protruding portion is used to movably coupled to the other part of the first trail and the second trail, and wherein both the first protruding portion and the second protruding portion move along the first trail to form the first path, and the second protruding portion moves along the second trail to form the second path.

6. The flash drive according to claim 5, wherein the first trail is in a linear contour, and the second trail is in at least a part of a circular contour.

7. The flash drive according to claim 5, wherein the first trail is divided into a first section and a second section, and the second section is connected between the first section and the second trail.

8. The flash drive according to claim 7, wherein the second trail is at least a part of a circular recess, the first section of the first trail is an elongated through hole of the housing, the second section is an elongated recess of the housing, the first protruding portion passes through the elongated through hole to be pivoted to the storage element and used to move back and forth around the elongated through hole, and the second protruding portion is used to move back and forth along the elongated recess and along the circular recess,
wherein when the first protruding portion moves to an end of the elongated through hole which is near the elongated recess, the second protruding portion is located on the junction between the circular recess and the elongated recess,
wherein when the first protruding portion moves along the elongated through hole and away from the elongated recess, the second protruding portion is located in the elongated recess to be limited moving along the first path.

9. The flash drive according to claim 8, wherein the second trail is a circular recess, the first trail is a diameter of the circular recess, a relative distance between the first protruding portion and the second protruding portion is equal to a radius of the circular recess, the second protruding portion is used to move back and forth on the junction between the circular recess and the elongated recess along the circular recess, such that the second connector is rotated out of or in the integrating member.

10. The flash drive according to claim 5, wherein the first connector is a micro universal serial bus (Micro-USB) connector, and the second connector is a universal serial bus (USB) connector.

11. A method of operating a flash drive, wherein the flash drive comprises a storage element, a housing and an integrating member, the storage element has a first connector and a second connector, a part of the storage element is movable contained in the housing, the integrating member is pivoted to the storage element and movably coupled to the housing, the method comprising:
    driving the integrating member to move relatively to the housing back and forth in a first path, such that the first connector is exposed from or hidden in the housing, and the flash drive is transited between a first state and a second state; and
    driving the integrating member to move relatively to the housing in a second path and drive the storage element to move relatively to the integrating member back and forth, such that the second connector is exposed from or hidden in the integrating member, and the flash drive is transited between the first state and a third state, wherein the first path is connected with but different from the second path.

12. The method according to claim 11, wherein the integrating member is a recess structure having a front opening and a pair of side openings located at opposite sides of the front opening, when the flash drive is in the first state, the housing and the storage element are located in the recess structure, a part of the housing and a part of the storage element protrudes out of the recess structure through the front opening, and the first connector is hidden in the housing,
    during the process of the flash drive being transited from the first state to the second state, the housing moves relatively to the storage element and the integrating member along the first path to move from the front opening into the recess structure, such that the first connector is exposed from the housing, and
    during the process of the flash drive being transited from the first state to the third state, the housing moves along the second path and drives the storage element to rotate relatively to the integrating member, such that the second connector is rotated out of the integrating member through one of the side openings.

13. The method according to claim 12, wherein when the flash drive is in the first state, the second connector is hidden in the recess structure, when the flash drive is in the second state, the second connector is hidden in the recess structure with a part embedded into the housing, and when the flash drive is in the third state, the second connector protrudes out of the front opening.

14. The method according to claim 11, wherein the first path is a straight line, and the second path presents at least a part of a circle.

15. The method according to claim 14, wherein the first path is a diameter of the second path presenting at least a part of a circle.

16. The method according to claim 11, the first path is divided into a first section and a second section, and the second section is connected between the first section and the second path.

* * * * *